(12) United States Patent
Takenaka

(10) Patent No.: US 8,836,675 B2
(45) Date of Patent: Sep. 16, 2014

(54) DISPLAY DEVICE TO REDUCE THE NUMBER OF DEFECTIVE CONNECTIONS

(75) Inventor: Yuuichi Takenaka, Chiba (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 384 days.

(21) Appl. No.: 12/553,129

(22) Filed: Sep. 3, 2009

(65) Prior Publication Data

US 2010/0053127 A1    Mar. 4, 2010

(30) Foreign Application Priority Data

Sep. 3, 2008    (JP) .................................. 2008-226045

(51) Int. Cl.
- G06F 3/038    (2013.01)
- G09G 5/00    (2006.01)
- G02F 1/1345    (2006.01)
- G02F 1/1333    (2006.01)
- H05K 1/14    (2006.01)

(52) U.S. Cl.
CPC G02F 1/13452 (2013.01); *G02F 2001/133391* (2013.01); *H05K 1/147* (2013.01)
USPC .......................... 345/204; 349/149; 349/150

(58) Field of Classification Search
USPC ................................... 345/204; 349/149, 150
See application file for complete search history.

(56) References Cited

U.S. PATENT DOCUMENTS

| | | | |
|---|---|---|---|
| 6,169,530 B1 * | 1/2001 | Mori et al. ....................... | 345/93 |
| 6,407,795 B1 * | 6/2002 | Kamizono et al. ............ | 349/149 |
| 7,106,295 B2 | 9/2006 | Watanabe | |
| 7,868,860 B2 | 1/2011 | Watanabe | |
| 8,072,404 B2 | 12/2011 | Watanabe | |
| 2002/0140654 A1 * | 10/2002 | Kim et al. ....................... | 345/87 |
| 2005/0156840 A1 * | 7/2005 | Kim et al. ....................... | 345/87 |
| 2006/0001643 A1 * | 1/2006 | Jung et al. ..................... | 345/103 |
| 2008/0024475 A1 * | 1/2008 | Takenaka et al. ............. | 345/206 |

FOREIGN PATENT DOCUMENTS

| | | |
|---|---|---|
| JP | 63-241523 | 10/1988 |
| JP | 02-214817 | 8/1990 |
| JP | 07-140905 | 6/1995 |
| JP | 11-185850 | 7/1999 |
| JP | 11-231337 | 8/1999 |
| JP | 2003-270660 | 9/2003 |
| JP | 2006-126294 | 5/2006 |
| JP | 2006-237140 | 9/2006 |

* cited by examiner

*Primary Examiner* — Kwang-Su Yang

(74) *Attorney, Agent, or Firm* — Antonelli, Terry, Stout & Kraus, LLP.

(57) ABSTRACT

An object of the present invention is to reduce the number of defective connections between wires for source drivers and video signal lines. The present invention provides a display device having a display panel with a number of scan signal lines and a number of video signal lines, first wiring boards having first circuit parts connected to the scan signal lines, second wiring boards having second circuit parts connected to the video signal lines, and a control circuit where two opposite sides of the display panel each have a number of first wiring boards, the other two sides each have a number of second wiring boards, and the second wiring boards each have a first wire for connecting the control circuit and a second circuit part, a second wire for connecting a second circuit part and a video signal line, and a third wire for connecting the control circuit and a first circuit part in one of the two regions between which the first wire and the second wire are provided.

9 Claims, 5 Drawing Sheets

DISPLAY DEVICE TO REDUCE THE NUMBER OF DEFECTIVE CONNECTIONS

The present application claims priority over Japanese Application JP 2008-226045 filed on Sep. 3, 2008, the contents of which are hereby incorporated into this application by reference.

BACKGROUND OF THE INVENTION (1) Field of the Invention
[Technical Field]

The present invention relates to a display device, and in particular, to a technology which is effective when applied to high-definition liquid crystal display devices having a large screen.

(2) Related Art Statement
[Background Technology]

Conventional active matrix type liquid crystal display devices are used as liquid crystal displays for liquid crystal televisions and personal computers (PC's), for example.

Active matrix type liquid crystal display devices (hereinafter simply referred to as liquid crystal display devices) have a display panel having a number of scan signal lines and a number of video signal lines, a first drive circuit for applying a scan signal to each of the number of scan signal lines, a second drive circuit for applying a video signal to each of the number of video signal lines, and a control circuit for controlling the operation of the first drive circuit and the second drive circuit.

In addition, in the case of a large (large-screen) liquid crystal display device used for a liquid crystal television, the first drive circuit and the second drive circuit are usually formed of a number of drive circuit parts (IC chips). Here, the respective drive circuit parts are mounted on a flexible wiring board, for example. In the following, the drive circuit parts used for the first drive circuit are referred to as gate driver IC's, and the drive circuit parts used for the second drive circuit are referred to as source driver IC's.

In addition, in liquid crystal display devices used for liquid crystal televisions, the control circuit and the first drive circuit are connected via wires on the flexible wiring board on which source driver IC's are mounted and wires on the liquid crystal display panel, for example.

Furthermore, the size, definition and drive speed of liquid crystal display devices used for liquid crystal televisions has been increasing in recent years. Therefore, in recent years, in high-precision, large-scale liquid crystal display devices, a number of first flexible wiring boards on which gate driver IC's are mounted are connected on the two short sides of the liquid crystal display panel, and a number of second flexible wiring boards on which source driver IC's are mounted are connected on the two long sides of the liquid crystal display panel (see JP2006-237140A, for example).

SUMMARY OF THE INVENTION

Problem to Be Solved by the Invention

It is desirable in liquid crystal display devices for all first flexible wiring boards connected to one liquid crystal display panel to have the same configuration, from the point of view of the cost of manufacture. Likewise, it is desirable for all second flexible wiring boards connected to one liquid crystal display panel to have the same configuration, from the point of view of the cost of manufacture.

Therefore, in the case where the control circuit and the gate driver IC's (first drive circuit) are connected via a number of second flexible wiring boards on which source driver IC's are mounted, first wires for connecting the control circuit and the source driver IC's, second wires for connecting the source driver IC's and video signal lines, third wires for connecting the control circuit and the gate driver IC's (first drive circuit), and fourth wires for connecting the control circuit and the counter electrodes of the pixels (or a common electrode) in the display region are provided in each of the second flexible wiring boards connected to one liquid crystal display panel.

At this time, the third wires are a group of wires, and provided in two regions on each second flexible wiring board between which the first wires and the second wires are provided.

In addition, conventional liquid crystal display devices were examined in order to find a way to increase the number of outputs on the source driver IC's in order the reduce the manufacturing cost and the like.

In the case where more outputs of the source driver IC's are mounted on the second flexible wiring boards, however, the number of second wires also increases. At this time, when the size of the second flexible wiring boards are not large, it is necessary to narrow the pitch of the second wires. Therefore, a problem arises, such that connections easily break due to mismatching second wires and video signal lines.

In addition, the pitch of the second wires may be greater with second flexible wiring boards of a larger size, for example, in order to prevent connections from breaking between the second wires and the video signal lines. However, another problem arises, such that second flexible wiring boards of a larger size cost more to manufacture.

An object of the present invention is to provide a technology which makes it possible to reduce the number of defective connections between wires on the flexible wiring boards on which source driver IC's are mounted and video signal lines.

Another object of the present invention is to provide a technology which makes it easy to increase the number of outputs of source drivers on flexible wiring boards on which source driver IC's are mounted.

Still another object of the present invention is to provide a technology which makes it possible to prevent the manufacturing cost of flexible wiring boards on which source driver IC's having many outputs are mounted from increasing.

The above described and other objects, as well as novel features, of the present invention will become clearer from the description of the present specification and the accompanying drawings.

Means for Solving Problem

The gist of representative embodiments of the invention disclosed in the present application is as follows.

(1) A display device having: a display panel having a number of scan signal lines and a number of video signal lines; a number of first flexible wiring boards having first drive circuit parts for applying a scan signal to the above described scan signal lines; second flexible wiring boards having second drive circuit parts for applying a video signal to the above described video signal lines; and a control circuit for controlling the operation of the above described first drive circuit parts and the above described second drive circuit parts, wherein a first section and a second section in the periphery of the above described display panel which face each other with a display region in between each have a number of the above described first flexible wiring boards connected, a third section and a fourth section in the periphery of the above described display panel which face each other with a display region in between each have a number of the above described second flexible wiring boards connected, the above described second flexible wiring boards each have first wires for connecting the above described control circuit and the above described second drive circuit parts, second wires for connecting the above described second drive circuit parts and the above described video signal lines, and third wires for connecting the above described control circuit and the above described first drive circuit parts in one of the two regions between which the above described first wires and the above described second wires are provided, and the above described first drive circuit parts mounted on the above described respective first flexible wiring boards connected to the above described first section of the above described display panel are connected to the above described control circuit via a wire on the above described first flexible wiring boards, a wire on the above described display panel, and a third wire provided on one of the second flexible wiring boards connected to the above described fourth section of the above described display panel.

(2) The display device according to the above (1), wherein the positional relationship between the first wires, the second wires and the third wires on the above described second flexible wiring boards connected to the above described display panel are all the same.

(3) The display device according to the above (1), wherein the above described display panel has a number of TFT elements, a number of pixel electrodes and a number of common current supplying wires, TFT electrodes and pixels having a first electrode connected to a video signal line via a TFT electrode are arranged in a matrix in the above described display region of the above described display panel, and the above described second flexible wiring boards have fourth wires for connecting the above described control circuit and the above described common current supplying wires in each of two regions between which the above described first wires and the above described second wires are provided.

(4) The display device according to the above (1), wherein the above described display panel is approximately rectangular, the above described first section and the above described second section are along two short sides which face each other with the above described display region in between, and the above described third section and the above described fourth section are along two long sides which face each other with the above described display region in between.

(5) The display device according to the above (1), wherein the above described video signal lines include a first video signal line connected to the second flexible wiring board connected to the above described third section and a second video signal line connected to the second flexible wiring board connected to the above described fourth section.

(6) The display device according to the above (1), wherein the above described video signal lines are provided so as to connect the second flexible wiring board connected to the above described third section and the second flexible wiring board connected to the above described fourth section.

(7) The display device according to the above (1), wherein each of the above described scan signal lines is connected to one of the above described first drive circuit parts in the above described first section of the above described display panel and one of the above described first drive circuit parts in the above described second section of the above described display panel.

(8) The display device according to the above (1), wherein the above described display panel is a liquid crystal display panel where a liquid crystal material is sealed between a pair of substrates.

Effects of the Invention

In the display device according to the present invention, the number of defective connections between the second wires and the video signal lines on the second flexible wiring boards on which second drive circuit parts (source drivers) are mounted can be reduced.

In addition, the display device according to the present invention makes it easy to adjust the second flexible wiring boards for second drive circuit parts having more outputs.

In addition, the display device according to the present invention can prevent the manufacturing cost of the second flexible wiring boards on which second drive circuit parts having more outputs are mounted from increasing.

DETAILED DESCRIPTION OF THE INVENTION

In the following, the embodiments of the present invention are described in detail in reference to the drawings.

Here, the same symbols are used for components having the same function in all of the drawings showing the embodiments, and the descriptions thereof are not repeated.

Figure 1A:
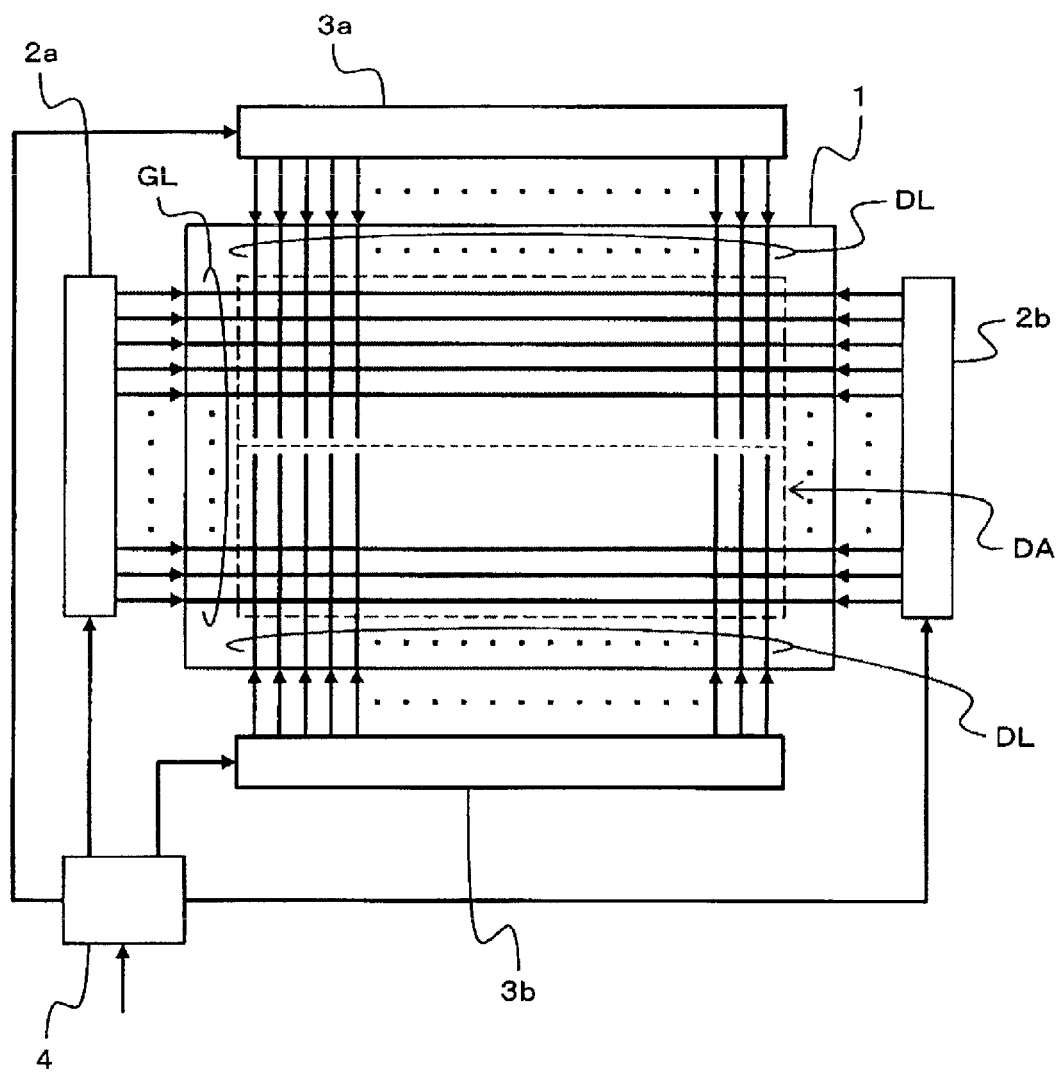
FIG. 1A is a schematic diagram showing the configuration of the liquid crystal display device according to one embodiment of the present invention.
Figure 1B:
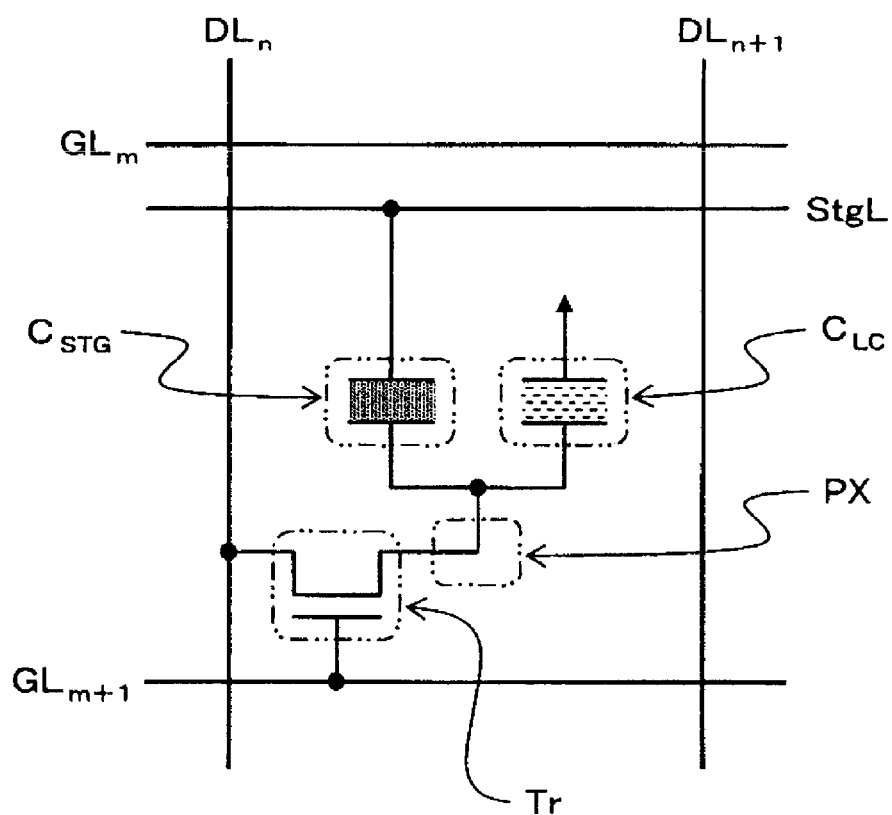
FIG. 1B is a schematic circuit diagram showing the configuration of the circuit in one pixel in the liquid crystal display panel according to the same embodiment.

FIGS. 1A and 1B are schematic diagrams showing the configuration of the liquid crystal display device according to an embodiment of the present invention.

FIG. 1A is a schematic diagram showing the configuration of the liquid crystal display device according to the embodiment of the present invention. FIG. 1B is a schematic circuit diagram showing the configuration of the circuit in one pixel in the liquid crystal display panel.

The present invention can be applied to large-scale (large screen) liquid crystal display devices used for liquid crystal televisions, for example. In addition, as shown in FIG. 1A, liquid crystal display devices to which the present invention can be applied have a liquid crystal display panel 1, two first drive circuits 2a and 2b, two second drive circuits 3a and 3b, and a control circuit 4 for controlling the operation of the two first drive circuits 2a and 2b and the two second drive circuits 3a and 3b, for example. In addition, though omitted in FIG.

1A, a backlight unit is provided on the rear of the liquid crystal display panel 1, for example, in the case of such a liquid crystal display device as a liquid crystal television.

The liquid crystal display panel 1 is a display panel where a liquid crystal material is sealed between a pair of substrates: a first substrate and a second substrate. In addition, the liquid crystal display device used as a liquid crystal television is of an active matrix type, and a number of scan signal lines GL and a number of video signal lines DL, for example, are provided. Here, FIG. 1A shows only some of the scan signal lines GL and some of the video signal lines DL, but in the actual liquid crystal display panel 1, much more scan signal lines GL and video signal lines DL are provided. In addition, though omitted in FIG. 1A, a number of holding capacitor lines and counter voltage signal lines, for example, are provided in the liquid crystal display panel 1.

At this time, a number of pixels are arranged in a matrix in the display region DA in the liquid crystal display panel 1, and the region occupied per pixel in the display region DA is surrounded by two adjacent signal lines GL and two adjacent video signal lines DL.

Each pixel in the display region DA has the circuit configuration shown in FIG. 1B, for example, as well as a TFT element TR, a pixel electrode TX and a counter electrode, not shown. In addition, the pixels have a pixel electrode PX, a counter electrode, a pixel capacitor $C_{LC}$ formed of a liquid crystal material (which may be referred to as liquid crystal capacitor), and a holding capacitor $C_{STG}$ formed of the pixel electrode PX, the holding capacitor line StgL and an insulating layer (which may be referred to as auxiliary capacitor or storage capacitor). Some recent liquid crystal display panels 1 are not provided with a holding capacitor $C_{STG}$.

In addition, though in the embodiment in FIG. 1B, the gate of the TFT element Tr is connected to the lower scan signal line $GL_{m+1}$ from among the two adjacent scan signal lines $GL_m$ and $GL_{m+1}$, the invention is not limited to this, and in some cases the gate may be connected to the upper scan signal line $GL_m$.

Likewise, though in the embodiment in FIG. 1B, the drain of the TFT element Tr is connected to the left video signal line $DL_n$ from among the two adjacent video signal lines $DL_n$ and $DL_{n+1}$, the invention is not limited to this, and in some cases the drain may be connected to the right video signal line $DL_{n+1}$.

The two first drive circuits 2a and 2b both apply a scan signal to the scan signal lines GL, and the first drive circuit 2a is provided on the left of the liquid crystal display panel 1 and the first drive circuit 2b is provided on the right of the liquid crystal display panel 1. At this time, the respective scan signal lines GL are connected both to the first drive circuit 2a and the first drive circuit 2b.

The two second drive circuits 3a and 3b both apply a video signal (gradation voltage) to the video signal lines DL, and the second drive circuit 3a is provided on the upper side of the liquid crystal display panel 1 and the second drive circuit 3b is provided on the lower side of the liquid crystal display panel 1. At this time, the video signal line DL which passes through the upper half region of one display region DA and the video signal line DL which passes through the lower half region are electrically isolated. In addition, the video signal line DL which passes through the upper half region is connected to the second drive circuit 3a provided on the upper side of the liquid crystal display panel 1, and the video signal line DL which passes through the lower half region is connected to the second drive circuit 3b provided on the lower side of the liquid crystal display panel 1.

The control circuit 4 may be referred to as TFT controller or timing controller, and is a circuit for outputting a video signal, power inputted from outside the liquid crystal display device, and a clock signal generated in the control circuit 4 to the two first drive circuits 2a and 2b, as well as to the two second drive circuits 3a and 3b. In addition, the control circuit 4 has a circuit for applying a common voltage to the counter electrodes and a circuit for supplying power to the light source of the backlight unit.

In addition, the liquid crystal display panel 1 in the liquid crystal display device to which the present invention can be applied may have the circuit configuration shown in FIGS. 1A and 1B, and the scan signal lines GL, the video signal lines DL, the TFT elements Tr, the pixel electrodes PX and the counter electrodes may have a well-known form in a plane, and a well-known positional relationship. Therefore, no detailed description is given for the forms in a plane and the positional relationship of the scan signal lines GL, the video signal lines DL, the TFT elements Tr, the pixel electrodes PX and the counter electrodes.

In addition, in the liquid crystal display device to which the present invention can be applied, the video signal lines DL provided on the liquid crystal display panel 1 are divided into video signal lines DL that pass through the upper half region in the display region DA and video signal lines DL that pass through the lower half region in the display region. Therefore, write-in can be carried out simultaneously in pixels in two rows in the same column. This scanning is referred to as division scanning, has high-write-in speed, and is effective in the case where there are a large number of pixels within the display region.

In the case where division scanning is not carried out, however, each video signal line DL may continue from the upper half region to the lower half region in one display region DA. In this case, each video signal line DL is connected both to the second drive circuit 3a provided on the upper side of the liquid crystal display panel 1 and the second derive circuit 3b provided on the lower side.

Figure 2A:
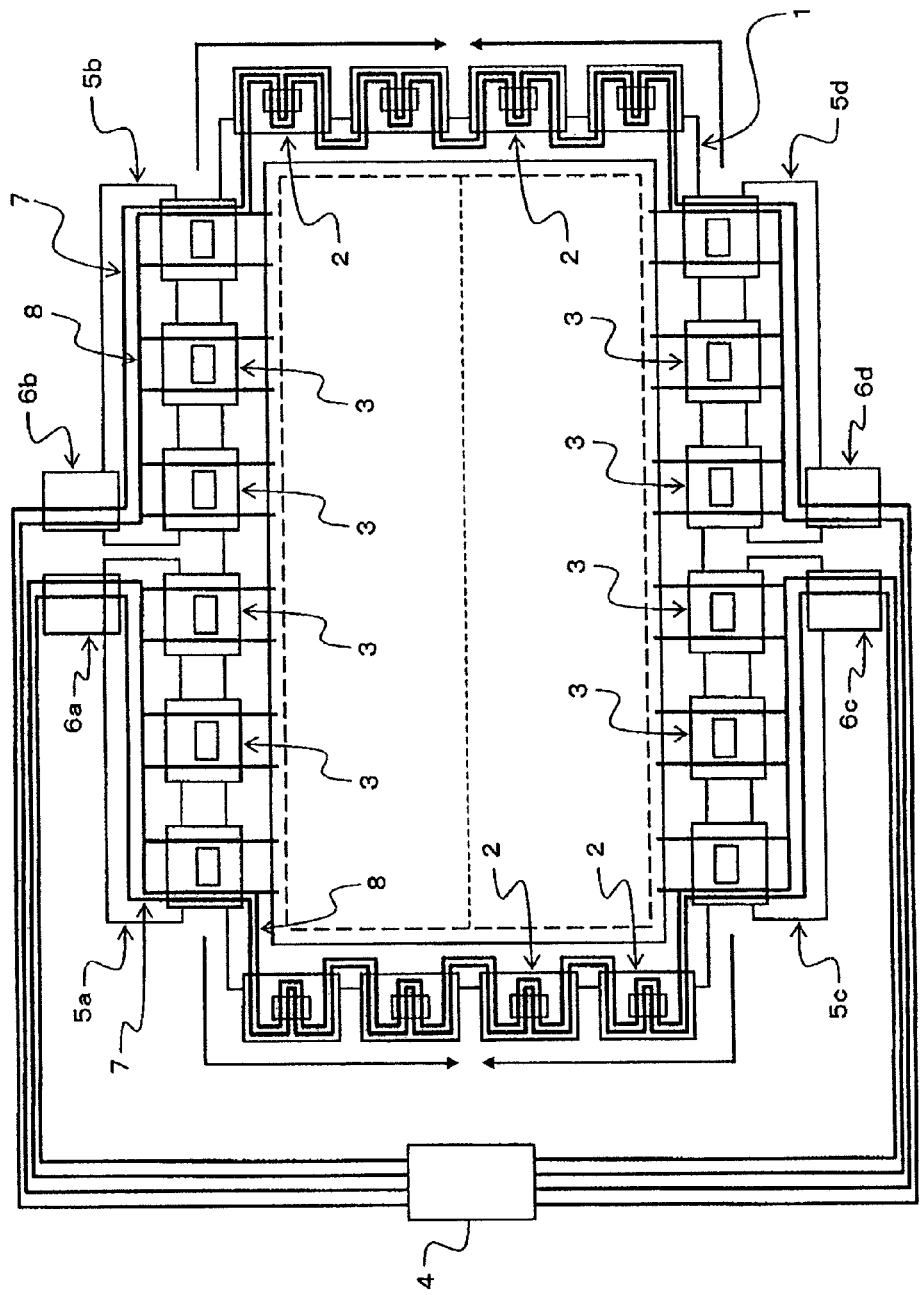
FIG. 2A is a schematic diagram illustrating an example of a method for connecting the first drive circuits and second drive circuits to the control circuit in a conventional liquid crystal display device.
Figure 2B:
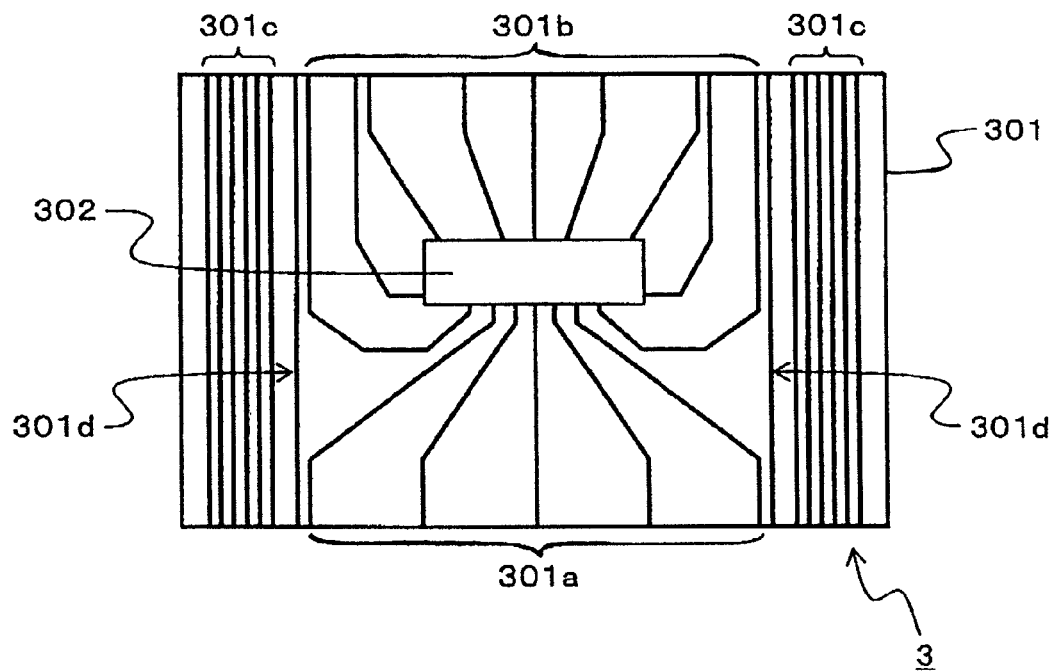
FIG. 2B is a schematic diagram showing an example of the configuration of a conventional source driver.

FIGS. 2A and 2B are schematic diagrams showing an example of a method for connecting the first drive circuit and the second drive circuit to the control circuit in a conventional liquid crystal display device.

FIG. 2A is a schematic diagram showing an example of a method for connecting the first drive circuit and the second drive circuit to the control circuit in a conventional liquid crystal display device. FIG. 2B is a schematic diagram showing an example of the configuration of a conventional source driver.

The first drive circuit 2a provided on the left side of the liquid crystal display panel 1 and the first drive circuit 2b provided on the right side are respectively formed of four gate drivers 2, for example, as shown in FIG. 2A. At this time, in each gate driver 2, a first drive circuit part (gate driver IC) is mounted on a first flexible wiring board.

In addition, the second drive circuit 3a provided on the upper side of the liquid crystal display panel and the second drive circuit 3b provided on the lower side are respectively formed of six source drivers 3, for example, as shown in FIG. 2A. At this time, in each source driver 3, a second drive circuit part (source driver IC) is mounted on a second flexible wiring board.

In addition, the three left side source drivers 3 provided on the upper side of the liquid crystal display panel 1 are connected to the control circuit 4 via the printed wiring board 5a and the third flexible wiring board 6a. In addition, the three right side source drivers 3 provided on the upper side of the liquid crystal display panel 1 are connected to the control circuit 4 via the printed wiring board 5b and the third flexible wiring board 6b.

In addition, the three left side source drivers 3 provided on the lower side of the liquid crystal display panel 1 are connected to the control circuit 4 via the printed wiring board 5c and the third flexible wiring board 6c. In addition, the three right side source drivers 3 provided on the lower side of the liquid crystal display panel 1 are connected to the control circuit 4 via the printed wiring board 5d and the third flexible wiring board 6d.

In addition, gate driver drive wires 7 for transmitting drive signals and drive power to the gate driver IC's in the respective gate drivers 3 from the control circuit 4 are provide in the conventional liquid crystal display device shown in FIG. 2A. At this time, the drive power for the top two gate electrodes provided on the left side of the liquid crystal display panel 1 is supplied via the third flexible wiring board 6a provided on the upper left side of the liquid crystal display panel 1, the printed wiring board 5a, the source driver 3 and the liquid crystal display panel 1. At this time, the drive power for the bottom two gate electrodes provided on the left side of the liquid crystal display panel 1 is supplied via the third flexible wiring board 6c provided on the bottom left side of the liquid crystal display panel 1, the printed wiring board 5c, the source driver 3 and the liquid crystal display panel 1.

In addition, the drive power for the top two gate electrodes provided on the right side of the liquid crystal display panel 1 is supplied via the third flexible wiring board 6b provided on the upper right side of the liquid crystal display panel 1, the printed wiring board 5b, the source driver 3 and the liquid crystal display panel 1. At this time, the drive power for the bottom two gate electrodes provided on the right side of the liquid crystal display panel 1 is supplied via the third flexible wiring board 6d provided on the bottom right side of the liquid crystal display panel 1, the printed wiring board 5d, the source driver 3 and the liquid crystal display panel 1.

In addition, common power supplying wires 8 are provided in the conventional liquid crystal display device shown in FIG. 2A. The common power supplying wires 8 are connected to the holding capacitor lines for forming holding capacitors within the respective pixel regions in vertical electrical field type liquid crystal display panels 1, and connected to counter voltage signal lines for supplying a voltage to the counter electrodes for forming an electrical field between the pixel electrode and the counter electrode in lateral electrical field type liquid crystal display panels 1.

The twelve source drivers 3 in the conventional liquid crystal display device shown in FIG. 2A usually all have the same structure; that for which an example is shown in FIG. 2B. Each source driver 3 is formed of a second flexible wiring board 301 and a source driver IC 302 mounted on the second flexible wiring board 301. At this time, the second flexible wiring board 301 has first wires 301a for connecting the control circuit 4 to the source driver IC's 302, second wires 301b for connecting the source driver IC's 302 to video signal lines DL, third wires 301c for connecting the control circuit 4 to gate drivers 3, and fourth wires 301d for connecting the control circuit 4 to counter electrodes.

At this time, the third wires 301c and the fourth wires 301d are provided in the two regions between which the first wires 301a and the second wires 301b are provided. In addition, the third wires 301c are actually groups of wires including a number of wires, as shown in FIG. 2B.

Thus, when a second flexible wiring board 301 where the third wires 301c and the fourth wires 301d are provided in the two regions between which the first wires 301a and the second wires 301b are provided is used, all of the source drivers 3 connected to one liquid crystal display panel 1 have the same structure. Therefore, the cost for manufacturing the source drivers 3 can be reduced, and at the same time, the efficiency of work for assembling the liquid crystal display panel 1 can be increased.

In the case where third wires 301c are provided in the two regions between which the first wires 301a and the second wires 301b are provided, as in the conventional source driver 3 shown in FIG. 2B, however, the regions where the first wires 301a and the second wires 301b can be provided become small. Therefore, it is necessary to make the pitch of the second wires 301b smaller, in order to increase the number of outputs of the source driver IC's without changing the dimensions of the second flexible wiring board 301, for example. Thus, when the pitch of the second wires 301b is smaller, the connection between the second wires 301b and the video signal lines DL easily breaks.

In addition, it is possible to increase the dimensions of the second flexible wiring board 301, for example, in order to increase the number of outputs of the source driver IC's. In the case where the dimensions of the second flexible wiring board 301 are larger, however, it is necessary to change the settings in the units for manufacturing the second flexible wiring board 301, as well as the dimensions of the insulating substrates used, for example, and thus, the cost of manufacture increases.

Embodiment

Figure 3A:
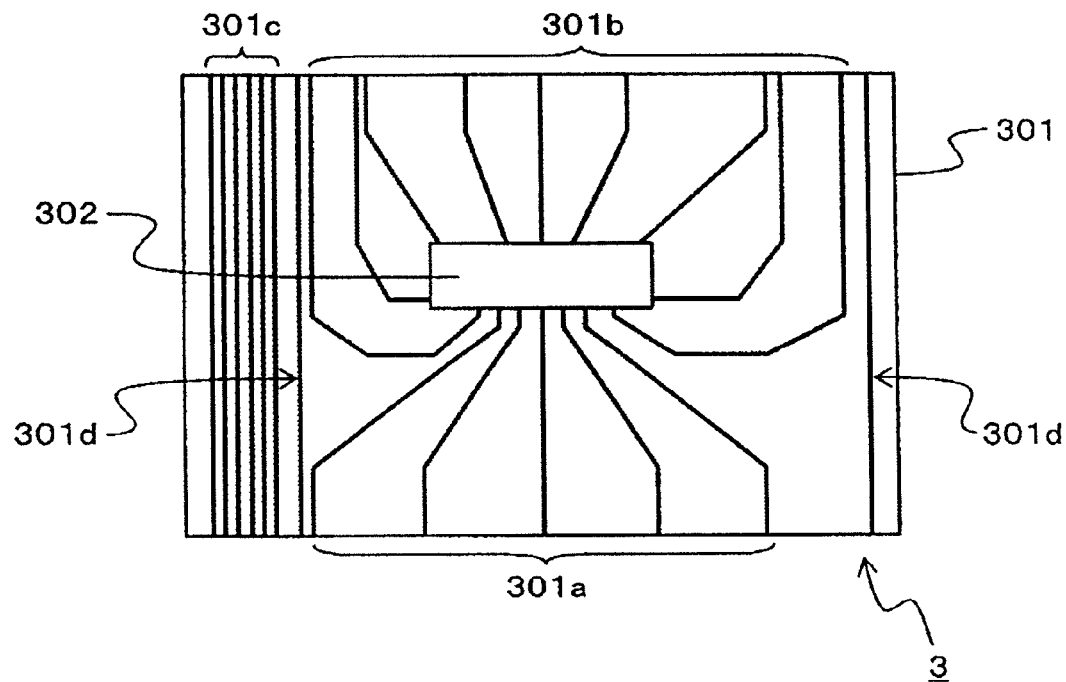
FIG. 3A is a schematic diagram showing the configuration of a source driver used in the liquid crystal display device according to another embodiment of the present invention.
Figure 3B:
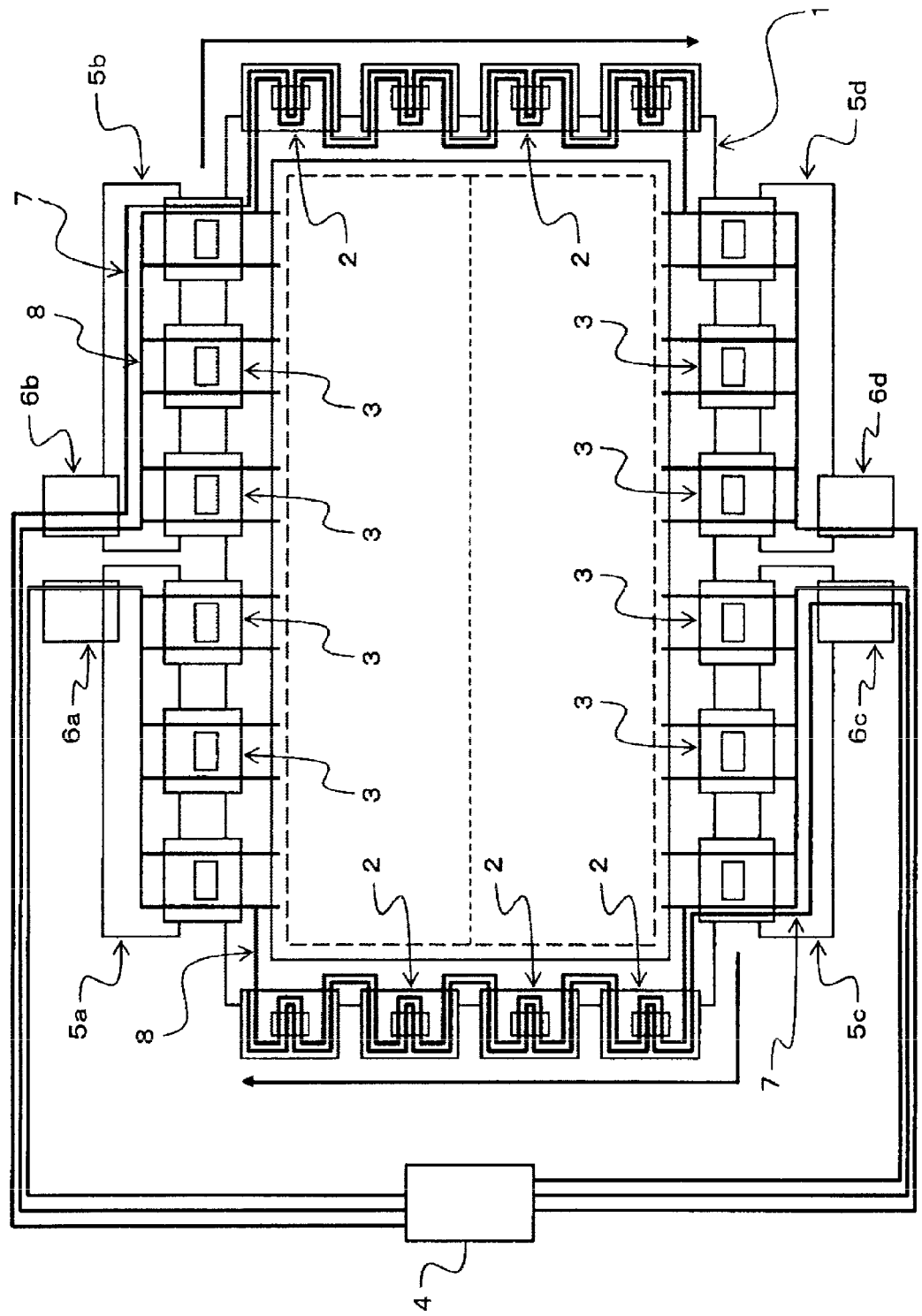
FIG. 3B is a schematic diagram illustrating an example of a method for connecting the first drive circuits and the second drive circuits to the control circuit in the liquid crystal display device according to the same embodiment.

FIGS. 3A and 3B are schematic diagrams showing the configuration of the liquid crystal display device according to one embodiment of the present invention.

FIG. 3A is a schematic diagram showing the configuration of the source driver used in the liquid crystal display device according to the embodiment of the present invention. FIG. 3B is a schematic diagram illustrating an example of a method for connecting the first drive circuits and the second drive circuits to the control circuit in the liquid crystal display device according to the present embodiment.

The liquid crystal display device according to the present embodiment uses source drivers 3, as shown in FIG. 3A, for example.

In order to solve the above described problems in conventional source drivers 3, the present inventors reviewed the arrangement of wires on the second flexible wiring board 301 and provided third wires 301c only in one of the two regions between which the first wires 301a and the second wires 301b are provided. As a result, regions where the first wires 301a and the second wires 301b are provided can be made wider than in the prior art for second flexible wiring boards 301 of the same dimensions. Thus, the pitch of the second wire 301b is sufficiently large, even in the case where the source driver IC's 302 have more outputs, and thus, the number of defective connections between the second wires 301b and the video signal lines DL can be reduced.

In addition, in the case where the source drivers 3 according to the present embodiment are used, gate driver wires 7 having the route shown in FIG. 3B may be provided. That is to say, drive signals and the drive power from the control circuit 4 are transmitted to the four gate drivers 2 provided along the left side of the liquid crystal display panel 1 via the wires on the third flexible wiring board 6c, which are provided on the left along the lower side of the liquid crystal display panel 1, the printed wiring board 5c, the source drivers 3 and the gate drivers 2, as well as wires for the liquid crystal display panel 1.

At this time, drive signals and the drive power from the control circuit 4 are transferred to the four gate drivers 2 provided along the right side of the liquid crystal display panel 1 via wires on the third flexible wiring board 6b, which are provided on the right along the upper side of the liquid crystal display panel 1, the printed wiring board 5b, the source drivers 3 and the gate drivers 2, as well as wires for the liquid crystal display panel 1.

In addition, in the case where the source drivers 3 according to the present embodiment are used, the route of the common current supplying wires 8 connected to the fourth wires 301d are the same as in the prior art in FIG. 2B.

As described above, in the liquid crystal display device according to the present embodiment, the number of defective connections between the second wires 301b for the source drivers 3 and the video signals DL can be reduced.

In addition, the liquid crystal display device according to the present embodiment makes it easy to adjust the second flexible wiring boards 301 for source driver IC's 302 (second drive circuit parts) having more outputs.

In addition, the liquid crystal display device according to the present embodiment can prevent the manufacturing cost for second flexible wiring boards on which source driver IC's 302 having more outputs from increasing.

In addition, the above described effects can be gained in the liquid crystal display device according to the present embodiment, which thus makes increase in the size (of the screen), definition and drive speed easier.

In addition, the second wires 301b and the fourth wires 301d are provided in the space from which the third wires 301c on the right of the source driver IC's 302 are removed in the example in FIG. 3A. However, the width of the second flexible wiring boards 301 may, of course, be reduced by the space that can be created by removing the third wires 301c in the case where the pitch of the second wires 301b is sufficiently large, as in the arrangement shown in FIG. 2b, for example.

Though the present invention is concretely described above on the basis of an embodiment, the present invention is not limited to this embodiment, and various modifications are, of course, possible within such a scope as not to deviate from the gist of the invention.

Though a liquid crystal display device is cited as an example of the above embodiment, the present invention is not limited to this, and can, of course, be applied to display devices having a similar structure which can be driven in accordance with a similar driving method.

What is claimed is:

1. A display device, comprising: a display panel having a plurality of scan signal lines and a plurality of video signal lines; a plurality of first flexible wiring boards having first drive circuit parts for applying a scan signal to said scan signal lines; second flexible wiring boards having second drive circuit parts for applying a video signal to said video signal lines; and a control circuit for controlling an operation of said first drive circuit parts and said second drive circuit parts,
    wherein a first section and a second section in the periphery of said display panel which face each other with a display region in between each have a plurality of said first flexible wiring boards connected,
    wherein a third section and a fourth section in the periphery of said display panel which face each other with the display region in between each have a plurality of said second flexible wiring boards connected,
    wherein said second flexible wiring boards each have first wires for connecting said control circuit and said second drive circuit parts, second wires for connecting said second drive circuit parts and said video signal lines, third wires for connecting said control circuit and said first drive circuit parts provided in only one of two regions of each of said second flexible wiring boards having said first wires and said second wires provided between said two regions, and at least one fourth wire different from the second and third wires for connecting said control circuit and a plurality of common current supplying wires provided in each of said two regions,
    wherein said first drive circuit parts mounted on said respective first flexible wiring boards connected to said first section of said display panel are connected to said control circuit via a wire on said first flexible wiring boards, a wire on said display panel, and said third wires provided on one of the second flexible wiring boards connected to said fourth section of said display panel, and
    wherein said third wires of only one of said second flexible wiring boards in said third section is electrically connected to said first drive circuit parts, and said third wires of only one of said second flexible wiring boards in said fourth section is electrically connected to said first drive circuit parts.

2. The display device according to claim 1, wherein the positional relationship among the first wires, the second wires and the third wires on said second flexible wiring boards connected to said display panel are all the same.

3. The display device according to claim 1, wherein
    said display panel has a plurality of TFT (Thin Film Transistor) elements, a plurality of pixel electrodes and the plurality of common current supplying wires, and
    TFT electrodes and pixels having a first electrode connected to a video signal line via a TFT electrode are arranged in a matrix in said display region of said display panel.

4. The display device according to claim 1, wherein
    said display panel is approximately rectangular,
    said first section and said second section are along two short sides which face each other with said display region in between, and
    said third section and said fourth section are along two long sides which face each other with said display region in between.

5. The display device according to claim 1, wherein said video signal lines include a first video signal line connected to the second flexible wiring board connected to said third section and a second video signal line connected to the second flexible wiring board connected to said fourth section.

6. The display device according to claim 1, wherein said video signal lines are provided so as to connect the second flexible wiring board connected to said third section and the second flexible wiring board connected to said fourth section.

7. The display device according to claim 1, wherein each of said scan signal lines is connected to one of said first drive circuit parts in said first section of said display panel and one of said first drive circuit parts in said second section of said display panel.

8. The display device according to claim 1, wherein said display panel is a liquid crystal display panel where a liquid crystal material is sealed between a pair of substrates.

9. The display device according to claim 1, wherein said at least one fourth wire is disposed so as to extend substantially in parallel to said third wires provided in said only one of said two regions and said at least one fourth wire is disposed so as to extend substantially in parallel to an edge of said flexible wiring board in another of said two regions without said third wires therein.

\* \* \* \* \*